United States Patent [19]

Ogura

[11] Patent Number: 5,677,552
[45] Date of Patent: Oct. 14, 1997

[54] OPTICAL CONTROL CIRCUIT FOR AN OPTICAL PNPN THYRISTOR

[75] Inventor: Ichiro Ogura, Tokyo, Japan

[73] Assignee: NEC Corporation, Tokyo, Japan

[21] Appl. No.: 23,124

[22] Filed: Feb. 26, 1993

[30] Foreign Application Priority Data

Apr. 23, 1992 [JP] Japan .................................. 4-104434

[51] Int. Cl.⁶ .................. H01L 29/74; H01L 29/06; H01L 31/111; H03K 3/42
[52] U.S. Cl. .................. 257/113; 257/21; 257/114; 257/167; 257/184; 257/187; 257/918; 307/311
[58] Field of Search .................. 257/21, 113, 114, 257/115, 167, 184, 187, 189, 918; 372/43, 50, 46; 307/311, 631, 637

[56] References Cited

U.S. PATENT DOCUMENTS 4,864,168  9/1989  Kasahara et al. .................. 257/113

FOREIGN PATENT DOCUMENTS 4-213432  8/1992  Japan .................. 257/113

OTHER PUBLICATIONS

"Integrated Optical Device of InGaAsP/InP Heterojunction Phototransistor and Inner Stripe Light–Emitting Diode", Akio Sasaki et al, IEEE Transactions on Electron Devices, vol. Ed–32, No. 12 Dec. 12, 1985.

"Surface–emitting Laser operation in vertical–to–surface transmission electrophotonic devices with a vertical cavity", T. Numai et al., Appl. Phys. Lett. 58(12), 25 Mar. 1991.

"Double heterostructure opteolectronic switch as a dynamic memory with low–power consumption", K. Kasahara et al., Appl. Phys. Lett. 52(9) pp. 679–681, 29 Feb. 1988.

Applied Physics Letters, vol. 58, No. 12, Mar. 25, 1991, pp. 1250–1252, T. Numai et al, "Surface–emitting laser operation in vertical–to–surface transmission electrophontonic devices with a vertical cavity".

*Primary Examiner*—Steven H. Loke
*Attorney, Agent, or Firm*—Sughrue, Mion, Zinn, Macpeak & Seas, PLLC

[57] ABSTRACT

The invention provides an optical functioning device which emits and receives light, and a driver circuit for controlling the device with light. In the device, elements, in which semiconductor multilayer-film reflecting mirrors are provided at both the upper and lower ends of a pnpn structure of semiconductors and which have light-emitting and light-receiving functions to act as optical resonators, are integrated two-dimensionally each with electrodes which are provided for the and the transistors act as phototransistors into which light is introduced.

19 Claims, 4 Drawing Sheets

OPTICAL CONTROL CIRCUIT FOR AN OPTICAL PNPN THYRISTOR

BACKGROUND OF THE INVENTION

1. Field of the Invention

This invention relates to a pnpn semiconductor element and a driver circuit therefor,

2. Description of the Related Art

Utilization of light in information processing is expected to allow high-speed processing and large capacity. Optical information processing is employed to effect processing of an optical signal using optical functioning elements having functions of threshold value processing, calculation, storage and so forth. It is considered an advantage of optical information processing over electric information processing that it allows parallel processing of a high density through the use of the incoherence of light. Therefore, investigations are directed to optical functioning elements which can be two-dimensionally integrated at a high density. As examples of optical functioning elements, a switch and an optical thyristor of pnpn structure in which a phototransistor and a pn junction light-emitting element are integrated have been reported.

The switch is disclosed in detail in "Optical Devices of InGaAsP/InP Heterojunction Phototransistors and Inner Stripe Light-Emitting Diodes," IEEE Transaction on Electron Devices, Vol. ED-32, 1985, pp. 2656–2660, and the optical thyristor is disclosed in detail in "Double heterostructure optoelectronic switch as a dynamic memory with low-power consumptions,"Applied Physics Letter, Vol. 52, 1988, pp. 679–681 (Kasahasa et al., 52 Appl. Phys Lett. 679). As the optical thyristor, an element of a surface-emitting laser type into which a vertical resonator structure is introduced in order to enhance efficiency and speed of emission of light is disclosed in "Surface-emitting laser operation in vertical-to-surface transmission electrophotonic devices with a vertical cavity," Applied Physics Letter, Vol. 58, 1991, pp. 1250–1251 (Numai et al., 58 Appl. Phys. Lett. 1250). Further, for the switch, a resetting operation has been reported wherein, using a phototransistor inside the structure of an optical switch, light is introduced into the phototransistor by a driver circuit connected in parallel to the optical switch in order to return an optical switch from the ON state to the OFF state.

However, the functioning elements mentioned above require operations to control the bias voltage when light is to be received or emitted and either lowering the voltage to a level close to zero for resetting in order to restore the initial state after switching or drawing out carriers by means of a gate electrode, and where they are two-dimensionally integrated at a high density, it is difficult to lay electric wiring lines for electrically driving individual devices from external electric circuits. Further, since the reported resetting operation using a phototransistor involves lowering the voltage applied to an optical switch by means of a phototransistor connected in parallel to the optical switch, high power and a considerable amount of time are required to carry out the resetting operation.

SUMMARY OF THE INVENTION

It is an object of the present invention to provide a pnpn semiconductor element wherein the drawbacks described above are eliminated and wherein bias control and a resetting operation can be performed with light and a driver circuit for the pnpn semiconductor element.

According to an aspect of the present invention, there is provided a pnpn semiconductor element having a pnpn layer structure including at least first semiconductor layer of either p or n conduction type and a second semiconductor layer of conduction type opposite that of the first semiconductor layer, a third semiconductor layer of the same conduction type as the first semiconductor layer, and a fourth semiconductor layer of the same conduction type as the second semiconductor layer, a pair of electrodes provided for the first and fourth semiconductor layers, a first gate electrode provided for the second semiconductor layer, and a second gate electrode provided for the third semiconductor layer.

According to another aspect of the present invention, there is provided a pnpn semiconductor element having a pnpn layer structure including at least first semiconductor layer of p or n conduction type, a second semiconductor layer of a conduction type opposite that of the first conduction type, a third semiconductor layer of the same conduction type as that of the first semiconductor layer, and a fourth semiconductor layer of the same conduction type as that of the second semiconductor layer, a pair of electrodes provided for the first and fourth semiconductor layers, and a gate electrode is provided for either one of the second semiconductor layer and the third semiconductor layer.

The pnpn semiconductor element having either of the constructions described above may be modified in such a manner that a pair of reflecting mirrors each formed from a semiconductor multilayer film are formed at the upper and lower ends of the pnpn layer structure, and the energy gaps of the first and fourth semiconductor layers are greater than the energy gaps of the second and third semiconductor layers, a non-doped layer structure which includes an active layer being formed between the second semiconductor layer and the third semiconductor layer.

In this instance, the pnpn semiconductor element may be modified in such a manner that the active layer has a quantum well structure wherein a semiconductor having a small energy gap and having the thickness of several tens of nanometers is held between a pair of layers of another semiconductor having an energy gap greater than the small energy gap semiconductor, and semiconductor layers, wherein the energy gap varies gradually within the range of several tens of nanometers are inserted at the interfaces of the quantum well structure.

According to a further aspect of the present invention, a driver circuit for driving a pnpn semiconductor element having any of the constructions described above is constructed in such a manner that the circuit is constituted of a bipolar transistor element obtained by using a portion of the pnpn layer structure of one of the pnpn semiconductor elements disposed two-dimensionally on a substrate, the circuit including first to third semiconductor layers or second to fourth semiconductor layers and being connected to at least one of a first gate electrode and a second gate electrode of the pnpn element so that supply and drawing out of electron current of the transistor circuit occurs through the gate electrodes.

The driver circuit may be modified in such a manner that light is introduced into the bipolar transistor so that the bipolar transistor acts as a phototransistor.

The above and other objects, features, and advantages of the present invention will become apparent from the following description in conjunction with the accompanying drawings which illustrate an example of a preferred embodiment of the present invention.

DETAILED DESCRIPTION OF THE PREFERRED EMBODIMENTS

Figure 1:
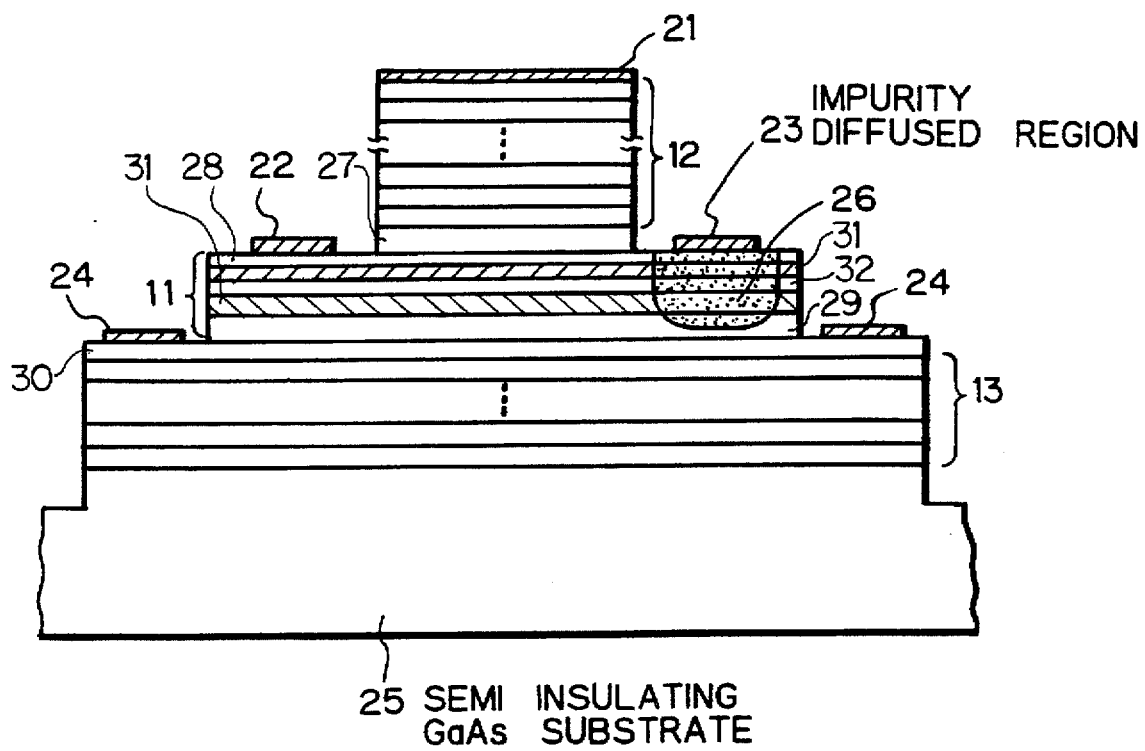
FIG. 1 is a schematic view showing the construction of an embodiment of a pnpn semiconductor element of the preset invention.

In the present invention, a pnpn structure made from semiconductor material is epitaxially grown on a substrate, and an electrode is formed for each pnpn layer of each of the elements separated from one another by etching. An element of the pnpn structure exhibits the characteristics of a thyristor when a forward voltage is applied to the p and n electrodes on the opposite ends of the semiconductor element. In particular, an element of pnpn structure remains in a high-resistance condition in which no current flows through it when the applied forward voltage is lower than a threshold voltage, but when the applied forward voltage exceeds the threshold voltage, the element switches into a low-resistance condition in which current flows through it. This switching also takes place when light is introduced into the element while the applied forward voltage is lower than the threshold voltage.

In a low-resistance condition, the element emits light when current is supplied to it, and an optical resonator, with which laser oscillation is obtained, is provided by forming, on each of the upper and lower ends of the pnpn structure of the element, a multilayer-film reflecting mirror having thickness equal to one fourth the wavelength of light to be emitted and composed of alternating layers, these layers being of two semiconductor types and two differing refractive indices. Here, by inserting into the active layer a structure composed of layers of gradually varying composition at the interfaces of a quantum well, in the ON state, the supplied current can be effectively trapped in the active layer and laser oscillation can be obtained at a low current supply level. When an electric field is applied, upon switching, to a non-doped portion 31 of the quantum well including the active layer, the heterobarrier at the interface of the quantum well is reduced by the inserted layers of gradually varying composition, consequently preventing the current generated by light from being trapped by the quantum well.

A bipolar transistor constituting a circuit for controlling the pnpn semiconductor element with light can be obtained by using three pup or npn electrodes of the electrodes of the pnpn element. Since the threshold voltage of the pnpn element drops by supplying current to the element from the gate electrode, if the bipolar transistor is caused to act as a phototransistor into which light is introduced and the phototransistor is connected to the gate electrode to supply current to the phototransistor, the threshold voltage of the pnpn element can be controlled by means of the intensity of light introduced into the phototransistor. Further, resetting can be performed at high speed by drawing out electron current from the gate electrode of the pnpn element in the ON state. If the phototransistor is connected so that electron current is drawn out from the gate electrode, resetting of the pnpn element can be performed at high speed by introducing light into the phototransistor.

The preferred embodiments of the present invention are described below with reference to the drawings.

FIG. 1 shows an embodiment of a pnpn semiconductor element of the present invention. The pnpn semiconductor element is constructed such that a pair of multilayer-film reflecting mirrors 12 and 13 each formed from alternating layers of GaAs and AlAs having thickness equal to λ/4n are disposed at the upper and lower ends of pnpn structure, comprised of first through fourth semiconductor layers, the above structure being formed on a substrate 25 of semi-insulating GaAs. In the expression λ/4n, which defines the thickness of the multilayer-film reflecting mirrors 12 and 13, λ is the wavelength of laser oscillation and n is the refractive index of GaAs or AlAs. The upper multilayer-film reflecting mirror 12 is of the p-type, and the lower multilayer-film reflecting mirror 13 is of the n-type. The reflective index of the semiconductor multilayer-film reflecting mirrors, which is approximately 99.3%, is obtained with 15 GaAs/AlAs layers. An active layer 32 has a quantum well structure of InGaAs and AlGaAs and is inserted between the center p layer 29 and the center n layer 28.

The element is formed in a mesa shape in two etching steps. In the first step, the multilayer film (12) and the p-type semiconductor layer 27 are etched into the n-type AlGaAs layer 28. In the second step, several layers (11) are etched into the lower semiconductor multilayer film (13), following which etching to the semi-insulating substrate is carried out. An anode electrode 21 is formed on the p-type multilayer film reflecting mirror, an n gate electrode 22, or first gate electrode is formed on n-type AlGaAs layer 28, a p gate electrode 23 or second gate electrode is formed on the diffused region 26 which is formed by diffusion of a p-type impurity into the n-type AlGaAs layer 28 and extends to the p-type GaAs layer 29, and a cathode electrode 24 is formed on the n-type semiconductor layer 30.

Figure 2:
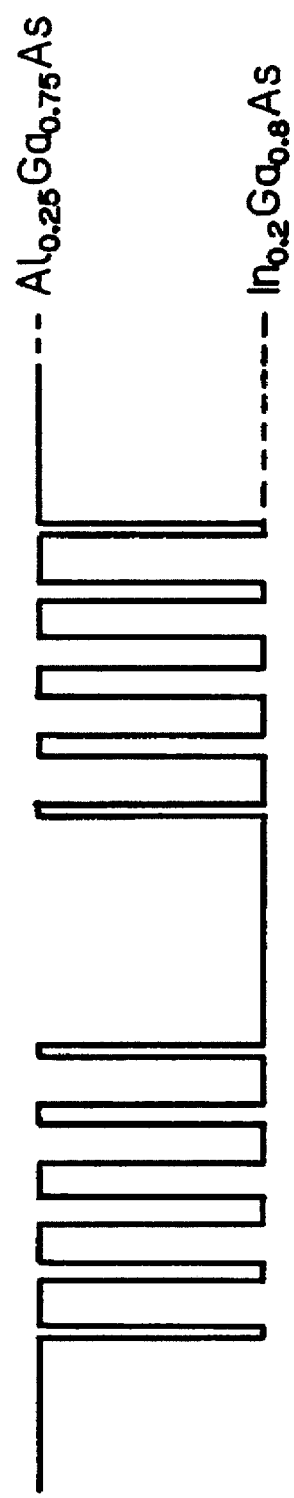
FIG. 2 is a diagrammatic view showing the construction of an active layer of the pnpn semiconductor element.

FIG. 2 is a diagrammatic view showing the structure of the active layer portion of the pnpn semiconductor element. At the interface of the quantum well structure wherein InGaAs is held between AlGaAs layers, a structure is inserted in which the period of the superstructure of InGaAs and AlGaAs is artificially varied by varying the thickness of the InGaAs and A/GaAs layers, so that the average composition varies gradually.

Figure 3:
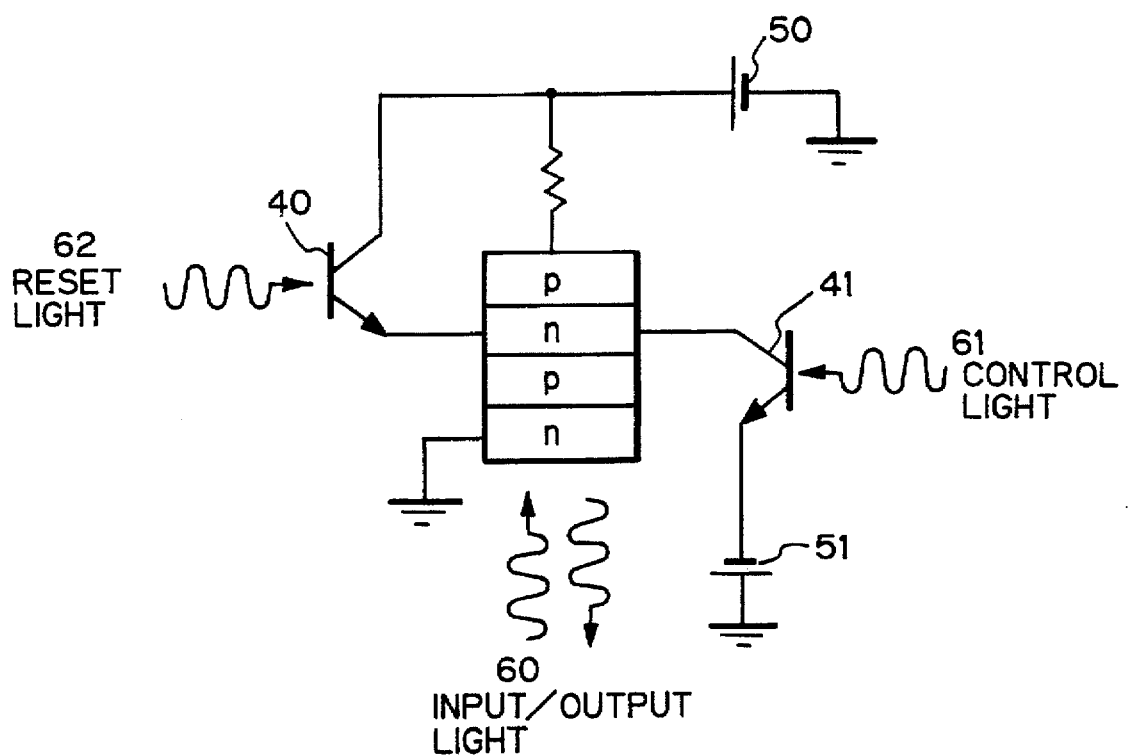
FIG. 3 is a circuit diagram showing the construction of a driver circuit for the pnpn semiconductor element.

FIG. 3 shows an embodiment wherein a driver circuit for the pnpn semiconductor element is formed with a configuration wherein a pair of npn-type phototransistors are connected to an n gate electrode. The npn-type transistors can be realized by driving the pnpn structure of FIG. 1 so that the cathode electrode 24 may act as the emitter electrode, the p gate electrode 23 may act as the base electrode and the n gate electrode 22 may act as the collector electrode. Thus, three continuous layers of the pnpn element are operated as a transistor. In the present embodiment, since the npn-type transistors are used as phototransistors, the bases are open and respond to input light signals. The emitter of phototransistor 40 is connected to the n gate electrode, the collector of phototransistor 40 is connected to the positive power source 50, while the collector of phototransistor 41 is connected to the n gate electrode, and the emitter of phototransistor 41 is connected to negative power source 51. The anode of the pnpn element is connected to the positive power source through a load resistor, and the cathode of the pnpn element is connected to the ground.

The positive power source is set to a value lower than the threshold voltage of the pnpn element so that a fixed electron current may be supplied to the pnpn element when the pnpn element is in the ON state. The intensity of light 60 to be introduced into the pnpn element is set to a value at which the element cannot be switched at the voltage of the positive power source, and control light 61 is introduced into phototransistor 41 while electron current is supplied to the n gate electrode connected to phototransistor 41. Consequently, the threshold voltage of the pnpn element drops so that it is switched by incident light 60. When reset light 62 is introduced into phototransistor 40 with the element in the ON state, electrons accumulated in the pnpn structure are drawn out from the n gate electrode connected to phototransistor 40 by the phototransistor so that the element is reset to the OFF state.

Figure 4:
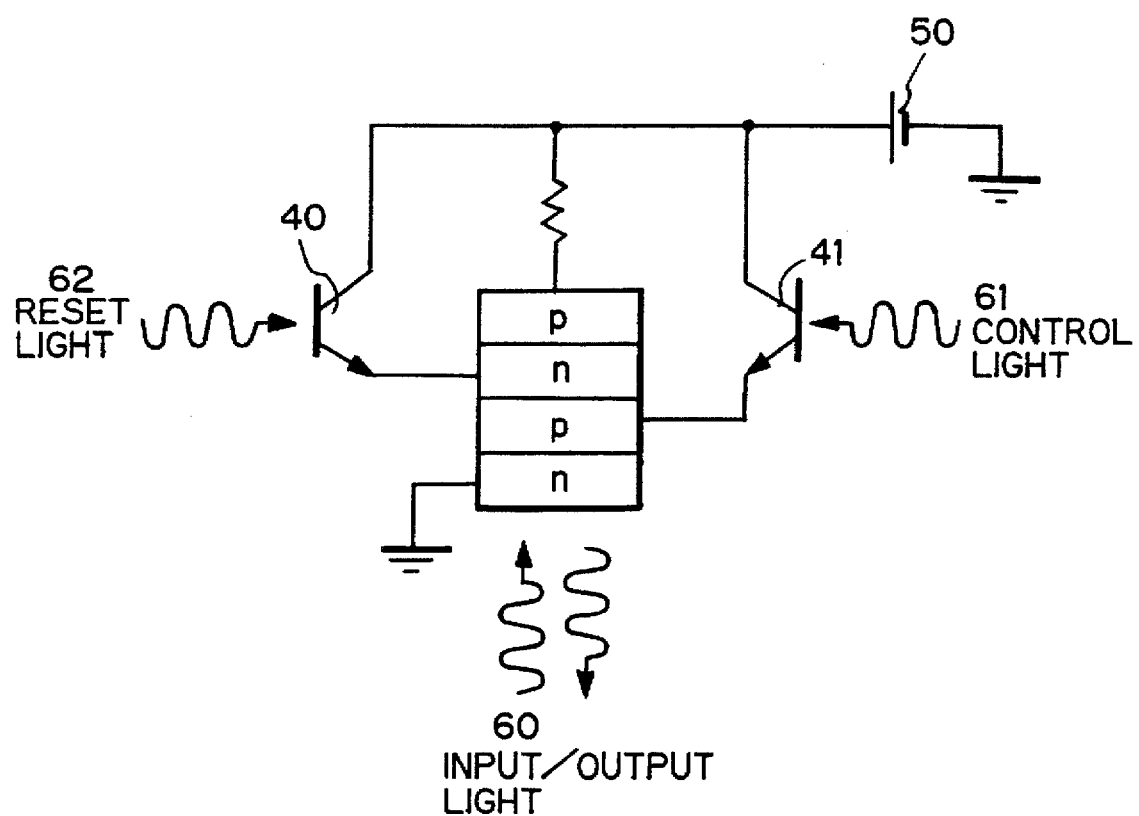
FIG. 4 is a similar view showing another example of the construction of a driver circuit for the pnpn semiconductor element.

FIG. 4 shows another embodiment wherein a driver circuit for the pnpn semiconductor element is realized with a configuration wherein a pair of npn-type phototransistors are connected to an n gate electrode and a p gate electrode. The emitter of phototransistor 40 is connected to the n gate electrode, and the collector of phototransistor 40 is connected to the positive power source 50. The emitter of phototransistor 41 is connected to the p gate electrode, and the collector of phototransistor 41 is connected to the positive power source 50. Thus, three continuous layers of the pnpn element are operated as a transistor. The operation of the present embodiment is similar to that of the embodiment of FIG. 3, and control light 61 is introduced into phototransistor 41 whereas reset light 62 is introduced into phototransistor 40. Here, electrons are drawn out from the p-gate of the pnpn element and supplied to transistor 41 according to the intensity of the incident light 61, and electrons are drawn out of the n-gate electrode of the pnpn element and supplied to transistor 40. In contrast to the embodiment of FIG. 3, the present construction requires only one power source.

When the phototransistors in the embodiments described above are replaced by phototransistors of the pnp-type, similar operation can be achieved by reversing the connections of the emitters and the collectors.

As described in detail above, according to the present invention, a pnpn semiconductor element having light-receiving and vertical emission laser outputting functions and a driver circuit which can effect bias control and resetting of the pnpn semiconductor element with light can be realized using transistors obtained from the pnpn structure.

Although a specific embodiment of the present invention has been described above, it is to be understood that the variations of the embodiment are possible and that the scope of the present invention is defined in the appended claims.

What is claimed is:

1. A driver circuit for a plurality of pnpn semiconductor elements two-dimensionally disposed on a substrate, each pnpn semiconductor element having a first semiconductor layer of a first conduction type, a second semiconductor layer of a second conduction type opposite to the first conduction type, a third semiconductor layer of the same conduction type as that of the first semiconductor layer, a fourth semiconductor layer of the same conduction type as that of the second semiconductor layer, and first and second gate electrodes, the driver circuit comprising:

a first pnpn semiconductor element;

a bipolar transistor formed from a portion of the pnpn semiconductor layers of a second pnpn semiconductor element, comprising three continuous layers of the second pnpn semiconductor element, wherein one of said first gate electrode and said second gate electrode of said first pnpn semiconductor element is connected to said bipolar transistor such that one of supplying electrons to the transistor and drawing out of electrons of the transistor is provided through said one of said first and second gate electrodes connected to said bipolar transistor.

2. A driver circuit according to claim 1, wherein each of the plurality of pnpn semiconductor elements further comprises electrodes provided for connection to each of said first and fourth semiconductor layers, wherein said first gate electrode is provided for said second semiconductor layer, and said second gate electrode is provided for said third semiconductor layer, wherein one of the electrodes of said second pnpn semiconductor element and the gate electrodes of said second pnpn semiconductor element each constitute a drive terminal for operating three continuous semiconductor layers as said bipolar transistor.

3. A Driver circuit as claimed in claim 1, wherein the first through fourth semiconductor layers comprise a pnpn layer structure, and wherein first and second reflecting mirrors are each formed from a semiconductor multilayer film, said first and second reflecting mirrors being formed at the upper and lower ends of said pnpn layer structure of each of said plurality of pnpn semiconductor elements, respectively, the energy gaps of said first and fourth semiconductor layers are greater than the energy gaps of said second and third semiconductor layers, and a non-doped layer structure which includes an active layer is formed between said second semiconductor layer and said third semiconductor layer.

4. A driver circuit as claimed in claim 3, wherein said active layer has a quantum well structure, a portion of said active layer comprising a semiconductor having a small energy gap and having a thickness of several tens of nanometers held between a pair of layers of another semiconductor, wherein each layer of said pair of layers of said another semiconductor has an energy gap greater than the semiconductor having said small energy gap, and a superstructure disposed between said portion of said active layer having said semiconductor having said small energy gap and said pair of layers of said another semiconductor and one of the second and third semiconductor layers, wherein said superstructure is comprised of alternating layers of varying thickness of said semiconductor having a small energy gap and said another semiconductor.

5. A driver circuit as claimed in claim 1, wherein said first conduction type is one of a p conduction type and a n conduction type and said second conduction type is one of a n conduction type and a p conduction type and different from said first conduction type.

6. A driver circuit according to claim 1, wherein each of the plurality of pnpn semiconductor elements further comprises a first electrode provided for connection to said first semiconductor layer and a second electrode provided for connection to said fourth semiconductor layer, wherein said first gate electrode of the first pnpn semiconductor element is provided for either one of said second semiconductor layer and said third semiconductor layer, and wherein the first gate electrode and the second gate electrode of said second pnpn semiconductor element and one of the first and the second electrodes of said second pnpn semiconductor element each constitute a terminal for operating three continuous semiconductor layers as a phototransistor.

7. A driver circuit as claimed in claim 6, wherein the first through fourth semiconductor layers comprise a pnpn layer structure, and wherein a pair of reflecting mirrors each formed from a semiconductor multilayer film are formed upon the upper and lower ends of said pnpn layer structure of each of said pnpn semiconductor elements, the energy gaps of said first and fourth semiconductor layers are greater than the energy gaps of said second and third semiconductor layers, and a non-doped layer structure which includes an active layer is formed between said second semiconductor layer and said third semiconductor layer.

8. A driver circuit as claimed in claim 7, wherein said active layer of said non-doped layer has a quantum well structure, a portion of said active layer comprising a semiconductor having a small energy gap and having a thickness of several tens of nanometers held between a pair of layers of another semiconductor, whereas each layer of said pair of layers of said another semiconductor has an energy gap greater than the semiconductor having said small energy gap, and a superstructure disposed between said portion of said active layer having said semiconductor having said small energy gap and said pair of layers of said another semiconductor and one of the second and third semiconductor layers, wherein said superstructure is comprised of alternating layers of varying thickness of said semiconductor having a small energy gap and said another semiconductor.

9. A driver circuit as claimed in claim 6, wherein said first conduction type is one of a p conduction type and a n conduction type and said second conduction type is one of a n conduction type and a p conduction type and different from said first conduction type.

10. A driver circuit as claimed in claim 1, wherein light is introduced into said bipolar transistor so that said bipolar transistor acts as a phototransistor.

11. A driver circuit comprising;

a plurality of pnpn elements being two-dimensionally disposed on a substrate, wherein each of said plurality of pnpn elements has first through fourth semiconductor layers and the second semiconductor layer of one of said plurality of pnpn elements has a gate electrode;

a first transistor having an emitter connected to the gate electrode of said one of said plurality of pnpn elements and a collector connected to a first potential;

a second transistor having an emitter connected to a second potential and a collector connected to the gate electrode of said one of said plurality of pnpn elements.

12. The driver circuit recited in claim 11, wherein said first transistor and said second transistor are each formed from three continuous semiconductor layers of another one of said plurality of pnpn elements.

13. The driver circuit recited in claim 12, wherein light is introduced into at least one of said first and second transistors so that said at least one of said first and second transistors acts as a phototransistor.

14. The driver circuit recited in claim 11, wherein the first semiconductor layer of said one of said plurality of pnpn elements is connected to the first potential and the fourth semiconductor layer of said one of said plurality of pnpn elements is connected to a third potential which is lower than the first potential.

15. A driver circuit comprising;

a pnpn element of a plurality of pnpn elements being two-dimensionally disposed on a substrate, wherein each of said plurality of pnpn elements has first through fourth semiconductor layers, the second semiconductor layer having a first gate electrode, and the third semiconductor layer having a second gate electrode;

a first transistor having an emitter connected to the first gate electrode of the pnpn element and a collector connected to a first potential;

a second transistor having an emitter connected to the second gate electrode of the pnpn element, and a collector connected to the first potential.

16. The driver circuit recited in claim 15, wherein said first transistor and said second transistor are each formed from three continuous semiconductor layers of one of the plurality of pnpn elements other than the pnpn element connected to the first and second transistors.

17. The driver circuit recited in claim 16, wherein light is introduced into at least one of said first and second transistors so that said at least one of said first and second transistors acts as a phototransistor.

18. The driver circuit recited in claim 15, wherein the first semiconductor layer of the pnpn element is connected to the first potential and the fourth semiconductor layer of the pnpn element is connected to a second potential which is lower than the first potential.

19. A driver circuit for a plurality of pnpn semiconductor elements two-dimensionally disposed on a substrate, each pnpn semiconductor element having first through fourth semiconductor layers, comprising:

a first pnpn semiconductor element of said plurality of pnpn semiconductor elements, having a first gate electrode and a second gate electrode;

a pair of bipolar transistors each formed from a portion of the pnpn semiconductor layers of a second and a third of said plurality of pnpn semiconductor elements, each transistor comprising three continuous layers of the respective pnpn semiconductor element, wherein at least one of said first gate electrode and said second gate electrode of the first pnpn semiconductor element is connected to said pair of transistors such that a supply of electrons from one of the transistors of said pair of transistors is provided through one of said first and second gate electrodes and drawing out of electrons by the other transistor of said pair of transistors is provided through said one of said first and second gate electrodes.

* * * * *

UNITED STATES PATENT AND TRADEMARK OFFICE
CERTIFICATE OF CORRECTION

PATENT NO.   : 5,677,552
DATED        : October 14, 1997
INVENTOR(S)  : Ichiro OGURA It is certified that error(s) appears in the above-identified patent and that said Letters Patent is hereby corrected as shown below:

Item No. [57], ABSTRACT, line 9, after "for the" insert --layers of the pnpn structure. The driver circuit consists of transistors formed from a pnp or npn portion of the pnpn structure,--.

Col. 2, line 66, change "preset" to --present--.

Col. 3, line 48, change "pup" to --pnp--.

Col. 4, line 38, change "A/GaAs" to --AlGaAs--.

Signed and Sealed this

Thirty-first Day of March, 1998

*Attest:*

BRUCE LEHMAN

*Attesting Officer*   Commissioner of Patents and Trademarks